US008102710B2

(12) United States Patent
Pekny et al.

(10) Patent No.: US 8,102,710 B2
(45) Date of Patent: Jan. 24, 2012

(54) SYSTEM AND METHOD FOR SETTING ACCESS AND MODIFICATION FOR SYNCHRONOUS SERIAL INTERFACE NAND

(75) Inventors: Theodore T. Pekny, Sunnyvale, CA (US); Victor Y. Tsai, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 300 days.

(21) Appl. No.: 11/873,826

(22) Filed: Oct. 17, 2007

(65) Prior Publication Data
US 2009/0103362 A1    Apr. 23, 2009

(51) Int. Cl.
G11C 11/34 (2006.01)
G11C 8/00 (2006.01)

(52) U.S. Cl. ......... 365/185.08; 365/185.17; 365/185.33; 365/233.1; 365/238.5; 365/240

(58) Field of Classification Search ............. 365/185.08, 365/185.11, 185.12, 185.17, 185.18, 185.29, 365/185.33, 233.1, 238.5, 240, 185.09; 711/157
See application file for complete search history.

(56) References Cited

U.S. PATENT DOCUMENTS

| | | | | | |
|---|---|---|---|---|---|
| 5,357,621 | A | * | 10/1994 | Cox | 711/172 |
| 5,959,883 | A | * | 9/1999 | Brennan et al. | 365/185.03 |
| 5,991,194 | A | * | 11/1999 | Jigour et al. | 365/185.04 |
| 6,363,030 | B1 | * | 3/2002 | Ooishi | 365/233.1 |
| 7,243,185 | B2 | * | 7/2007 | See et al. | 365/185.33 |
| 7,296,124 | B1 | * | 11/2007 | Falik | 711/157 |
| 7,345,916 | B2 | * | 3/2008 | Yang et al. | 365/185.14 |
| 7,388,782 | B2 | * | 6/2008 | Tokiwa | 365/185.11 |
| 7,397,717 | B2 | * | 7/2008 | Chen et al. | 365/185.33 |
| 7,450,422 | B2 | * | 11/2008 | Roohparvar | 365/185.17 |
| 7,457,155 | B2 | * | 11/2008 | Nazarian | 365/185.33 |
| 7,483,334 | B2 | * | 1/2009 | Ha | 365/233.1 |
| 7,558,900 | B2 | * | 7/2009 | Jigour et al. | 710/305 |
| 7,668,011 | B2 | * | 2/2010 | Kye et al. | 365/185.33 |
| 2006/0236204 | A1 | | 10/2006 | Lee et al. | |
| 2007/0115743 | A1 | * | 5/2007 | Sartori et al. | |

OTHER PUBLICATIONS

U.S. Appl. No. 11/873,805, filed Oct. 17, 2007, Pekny.
U.S. Appl. No. 11/873,816, filed Oct. 17, 2007, Pekny et al.
U.S. Appl. No. 11/873,826, filed Oct. 17, 2007, Pekny et al.
U.S. Appl. No. 11/873,833, filed Oct. 17, 2007, Pekny et al.
Micron Technical Note TN-28-01 Boot Block Flash Memory Technology FT01 p. 65—Rev. Dec. 1999.
Mciron Technical Note TN-28-02 Bulk Erase to Boot Block Conversion FT02 p. 65—Rev. Dec. 1999.
Micron Flash Memory MT28F008B3 MT28F800B3 3v Only, Dual Supply (Smart 3) Q10.fm—Rev. E Jun. 2004 EN.

(Continued)

Primary Examiner — Trong Phan
(74) Attorney, Agent, or Firm — Fletcher Yoder

(57) ABSTRACT

The invention includes a system and method of modifying a setting of a NAND flash memory device using serial peripheral interface (SPI) communication from a master to the NAND flash memory device. One embodiment generally includes sending an enable signal to a first memory circuit input, sending a clock signal to a second memory circuit input, sending a command signal synchronized to the clock signal to a third memory circuit input, sending a memory register address signal synchronized to the clock signal to the third memory circuit input, and sending a setting signal synchronized to the clock signal to the third memory circuit input.

9 Claims, 8 Drawing Sheets

OTHER PUBLICATIONS

Micron Technical Note NAND Flash Security TN-2900_nand_security.fm—Rev. B May 2007 EN http://download.micron.com/pdf/technotes/nand/tn2911.pdf; May 2007.

TMS 320x28xx, 28xxx DSP Serial Peripheral Interface (SPI) Reference Guide Literature No. SPRU059D Jun. 2002—Revised Nov. 2006.

Micron NAND Flash Memory MT29F4G08AAA, MT29F4G08BAA, MT29F4G08DAA, MT29F16G08FAA 4gb_nand_m4oa_1.fm—Rev. B Feb. 2007 EN.

Open NAND Flash Interface Specification Revision 1.0 Dec. 28, 2006.

Cihan Tuzcu: "Ditial Design of Serial Flash Memory Controller with SPI Interface for Embedded Systems"; PhD Thesis Sabanci University, [Online]; May 31, 2004; XP002515411; Turkey; Retrieved from the Internet: URL:http://digital.sabanciuniv.edu/tezler/tezler/mdbf/master/tuzcuc/ana.pdf [retrieved on Feb. 14, 2009]; p. 1-52.

ATMEL: "32-megabit 2.7-volt Only Serial Firmware DataFlash Memory AT25DF321" ATMEL Spec, [Online] Jul. 2007; XP002515507; Retrieved from the Internet: URL:http://www.atmel.com/dyn/resources/prod_documents/doc3669.pdf [retrieved on Feb. 14, 2007]; the whole document.

STMicroelectronics.: "M25P80 8 Mbit, Low Voltage, Serial Flash Memory with 40MHz SPI Bus Interface" STMicroelectronics., [Online] Apr. 2004; XP002515508; Retrieved from the Internet: URL:http://pdf1.alldatasheet.net/datasheet-pdf/view/22809/STMICROELECTRONICS/M25P80-VMW6T.html [retrieved on Feb. 14, 2009].

* cited by examiner

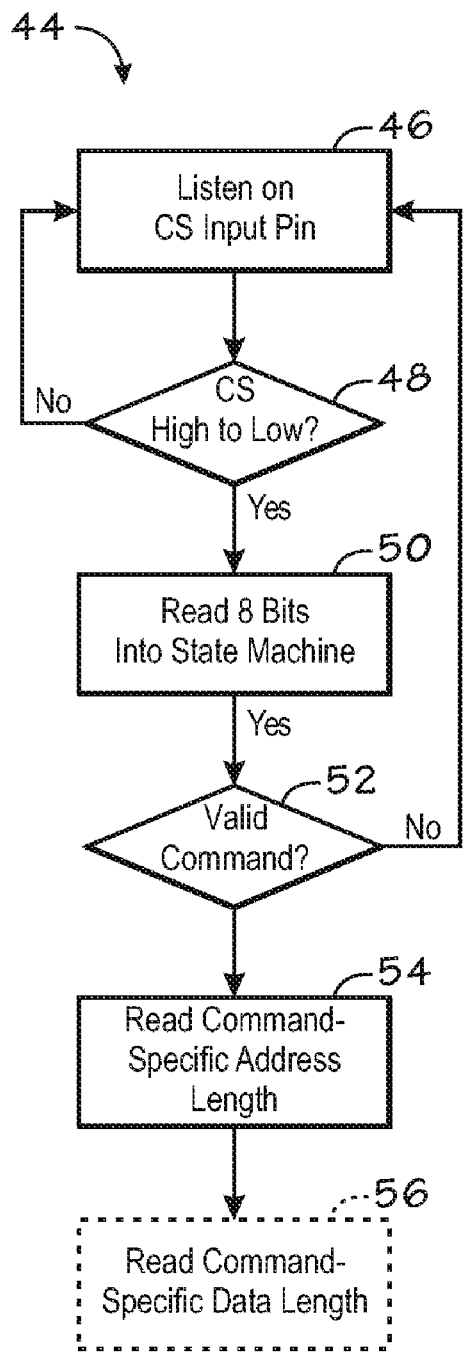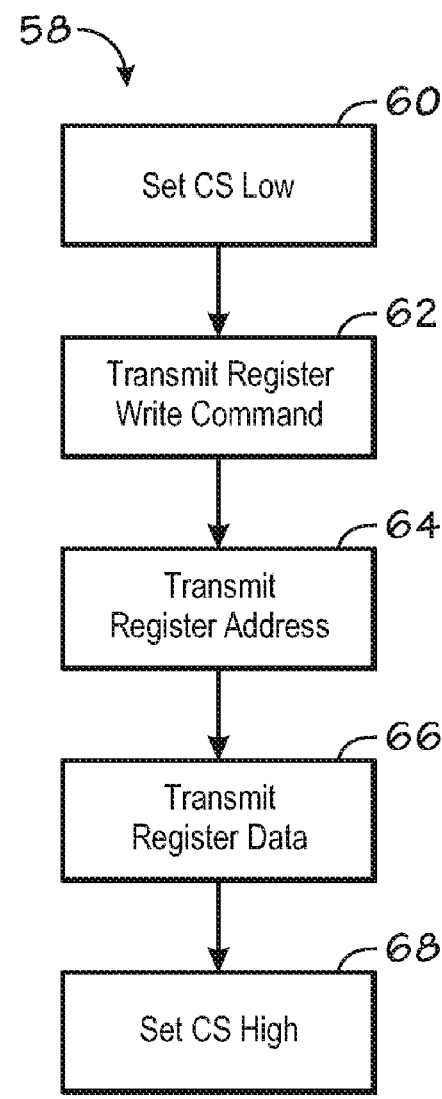
FIG. 2
FIG. 3

SYSTEM AND METHOD FOR SETTING ACCESS AND MODIFICATION FOR SYNCHRONOUS SERIAL INTERFACE NAND

BACKGROUND

1. Field of the Invention

Embodiments of the present invention relate generally to accessing and modifying settings of a NAND flash memory device, and particularly to accessing and modifying settings of a NAND flash memory device configured for interconnection via serial peripheral interface.

2. Description of the Related Art

Generally, most NAND flash memory devices employ parallel communication between a NAND flash device and a host device across a multitude of input pins. Though effective, the quantity of pins vastly increases the amount of space a NAND flash memory device occupies on an integrated circuit (IC) chip. As an alternative to parallel communication, serial communication may reduce the number of interconnections. However, critical functionality may be reduced as the quantity of input pins decreases.

Serial peripheral interface (SPI) permits a synchronous serial data link between a master and one or more slave devices. For a synchronous serial connection to one slave device, SPI uses four wires, including chip select (CS), serial clock (SCK), master out slave in (MOSI, or SI), and master in slave out (MISO, or SO). To communicate with additional slave devices, a unique additional CS wire accompanies each device, though the additional devices may share the same SCK, SI, and SO wires. As slave devices are selected by the master one at a time, only one slave device will communicate with the master at any given moment.

The master typically enables a slave device by setting CS low. Once enabled, the slave device may communicate with the master. With data transmission synchronized to the serial clock signal (SCK), the master initiates the data frame, sending data signals on the slave in (SI) wire and receiving data on the slave out (SO) wire. Because both transmitting and receiving take place simultaneously, SPI communication may be referred to as full duplex.

Devices which have been configured to communicate using SPI include EEPROM and NOR flash memory, two forms of nonvolatile memory devices. SPI EEPROM allows ICs with as few as eight pins, while conventional EEPROM may require 32 pins or more. SPI NOR flash memory similarly allows ICs with substantially fewer pins than conventional NOR memory.

NOR flash memory may be considered well suited to SPI. Because NOR flash memory provides full address and data buses, NOR may offer random access to any memory location. Accordingly, with a serial communication protocol such as SPI, NOR may rather easily output a desired point of data.

On the other hand, NOR flash may generally prove less desirable than other memory formats, such as NAND flash, in many applications. NAND flash memory employs shorter erase times while occupying less die space than NOR flash. Additionally, NAND flash memory cells may endure a greater number of write and erase cycles than NOR flash, often by a factor of ten or more.

Due in part to the nature of NAND memory which reads out page by page, rather than providing random access to any memory location, NAND has been historically considered unfit for use with SPI. Moreover, because much standard NAND functionality depends on enabling various input pins at certain times, attempts to combine the two may require an unwieldy translation from SPI to standard NAND, and/or may fail to provide many useful features that may be desired.

Embodiments of the present invention may be directed to one or more of the problems set forth above.

BRIEF DESCRIPTION OF THE DRAWINGS

FIG. 2 is a flow chart illustrating a method of communication between a master and the memory device of FIG. 1;

FIG. 3 is a flow chart illustrating a method of performing a register write operation using the memory device of FIG. 1;

DETAILED DESCRIPTION OF SPECIFIC EMBODIMENTS

Figure 1:
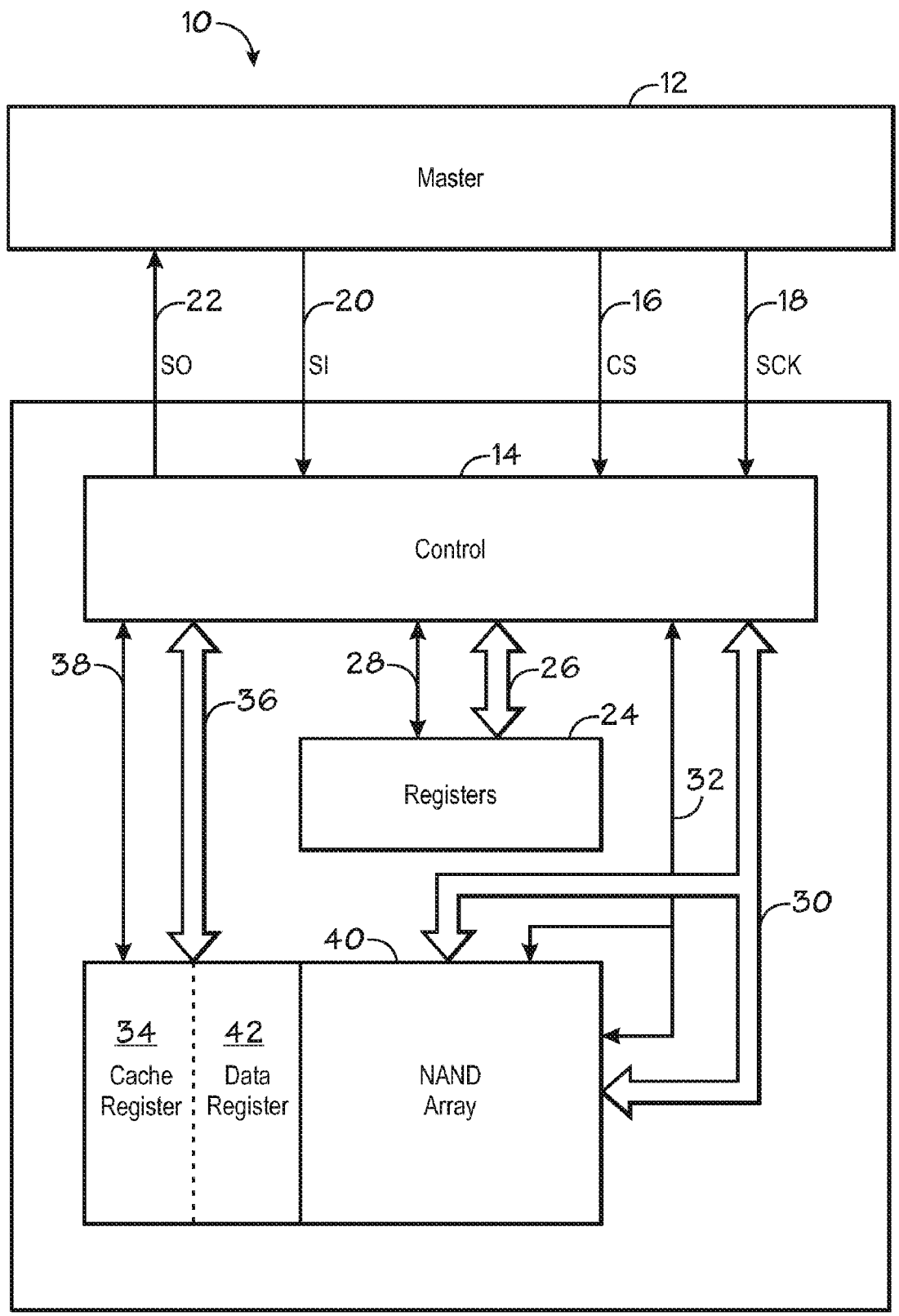
FIG. 1 is a block diagram of an SPI NAND memory device configured to communicate with a master in accordance with an embodiment of the invention.

Referring to FIG. 1, an SPI NAND memory device 10 interfaces with a master 12 using a serial peripheral interface (SPI) protocol. Controller 14 includes four interface pins including a chip select (CS) pin to receive a chip select signal CS 16, a clock (SCK) pin to receive a clock signal SCK 18, a slave in (SI) data input pin to receive an input signal SI 20, and a slave out (SO) data output pin to output an output signal SO 22. Data transfer between master 12 and controller 14 takes place serially across input signal SI 20 and output signal SO 22.

The master 12 may enable the controller 14 by setting chip select signal CS 16 from high to low. After enabling the controller 14, master 12 may send a clock signal SCK 18 and a corresponding data signal SI 20. Each bit transmitted by SI 20 (and SO 22) may be synchronous to either a rising or falling edge of clock signal SCK 18. For illustrative purposes, memory device 10 inputs data on SI 20 latched on a rising clock edge and outputs data on SO 22 released on a falling edge. Accordingly, the first rising edge of clock signal SCK 18 corresponds to the first bit of SI 20, and subsequent rising clock edges of SCK 18 correspond to subsequent bits of SI 20. In the same way, each bit output on SO 22 transitions on a falling edge of clock signal SCK 18.

Communication between master 12 and controller 14 generally begins when master 12 sets chip select CS 16 low. Master 12 subsequently sends clock signal SCK 18 and starts to send a message via SI 20. As discussed below, a message may generally comprise a one-byte command, followed by a memory address of one or more whole bytes, often further followed by data of one or more whole bytes. Controller 14 may respond by sending a synchronous message via SO 22. Due to the nature of SPI, controller 14 may continually output garbage data through SO 22 until an appropriate time when master 12 expects a response.

Master 12 may send a write register command or a read register command in a message to controller 14. The write register command or read register command causes controller 14 to access volatile memory registers 24. Data transfer to and from controller 14 and registers 24 occurs across a bus 26 controlled by control wire 28. Possible memory registers 24 may include, for example, a status register to indicate device operation status, a block writing lock register to prevent certain portions of memory from being written to, a one time programmable (OTP) enable register to enable reading from or writing to an OTP portion of memory, and/or a parameter page enable register to enable reading from or writing to a parameter page of memory.

Controller 14 may also access registers 24 when performing internal operations. Additionally, when a particular enable bit or flag is set for a given register, controller 14 may alter operations to enter an alternative operational mode, as discussed below.

Access to registers 24 may permit a user to control many functional aspects of memory device 10, such as output buffer drive strength, desired number of clock cycles of latency for outputting data, address cycle format to require whole bytes or to use a minimum number of addresses, and/or whether to enable or disable error correcting codes (ECC). Certain registers may hold, for example, error status, which may be reset upon the issuance of a register write command, while other registers may enable a user to control timing based on varying SCK 18 frequencies. Finally, for flexibility, a register may be configured to enable memory device 10 to switch between SPI NAND and NAND user modes and interfaces.

To perform an operation on nonvolatile NAND flash memory at a particular memory address, controller 14 may send the memory address signal across bus 30 to row and column decoders (not depicted). Controller 14 may control the activation of the row and column decoders using control wire 32. Depending on the operation, the controller may, for example, load data bytes into cache register 34 through bus 36, controlling cache register 34 with control wire 38. NAND memory array 40 receives data one page at a time through data register 42, which works in conjunction with cache register 34.

Communication method 44 of FIG. 2 provides an illustrative communication sequence from the perspective of controller 14. Beginning at step 46, controller 14 listens on the chip select input pin for a CS 16 signal. Decision block 48 indicates the moment of controller enablement which occurs when CS 16 transitions to low from high. If CS 16 transitions to high at any point thereafter, however, communication is interrupted and reset.

Once controller 14 is enabled, step 50 begins. Controller 14 reads the first eight bits sent across SI 20 into a state machine in controller 14 circuitry, though alternative embodiments may read in more than eight bits. Decision block 52 illustrates that if the state machine fails to recognize the eight bits as a valid command, the controller returns to listening for a CS 16 enable signal at step 46 and decision block 48, waiting to become re-enabled when master 12 again sets CS 16 from high to low.

If the state machine recognizes the first eight bits of SI 20 as a valid command in decision block 52, the controller 14 continues to read in subsequent data from SI 20. In step 54, controller 14 next reads in a predetermined length of bytes signifying an address, which may vary depending on the command identified by the state machine. In one embodiment, dummy bits may be transmitted as a header to the address to allow for proper byte alignment. For example, a 17 bit address may include a 7 bit dummy header, such that the entire address length conforms to a whole number of bytes. If the command requires data, the controller may next read in a predetermined length of bytes signifying data in optional step 56. A controller 14 may be configured to recognize a number of SPI NAND commands, such as page read, read status, random data read, program load, program random data input, program execute, random data input, etc.

FIG. 3 illustrates a register write method 58 for instructing a controller 14 to write data to a memory register of registers 24 in accordance with one embodiment of the invention. Master 12 first sets CS 16 low in step 60 to enable controller 14. Once enabled, controller 14 may receive a signal from master 12 through SI 20 synchronized to clock signal SCK 18.

In step 62, master 12 first transmits an eight bit register write command signal, 1Fh in hexadecimal format, to controller 14, though alternative embodiments may use a command signal of any predetermined length that a state machine of controller 14 may accommodate. Immediately after master 12 sends the command signal, step 64 begins and master 12 sends a register address signal indicating the address of the memory register to which to write. Though the present embodiment sends a register address signal of one byte, alternative embodiments may employ a register address of any size, but typically a whole number of bytes. To the extent a register address may comprise a number of bits not a multiple of eight, dummy bits may be sent to fill spaces, which controller 14 may simply ignore as "don't care" bits.

Proceeding to step 66 immediately after sending the register address signal, master 12 next sends a one byte data signal comprising the data to write to the register. Though the registers 24 of SPI NAND memory device 10 each comprise only one byte of data, alternative embodiments may employ registers 24 comprising a greater whole numbers of data bytes. Once master 12 has sent the data, master 12 thereafter terminates the communication sequence by setting CS 16 high.

Figure 4:
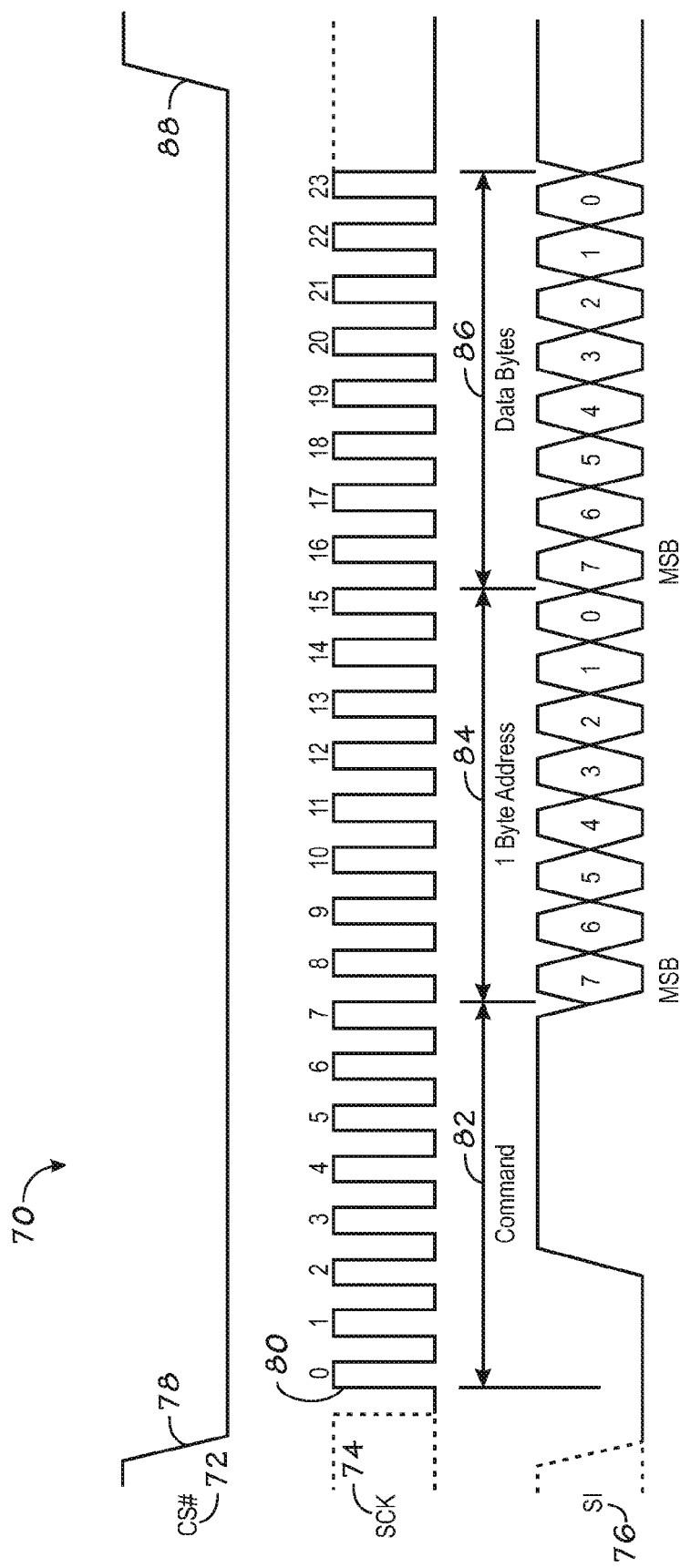
FIG. 4 is a timing diagram illustrating the timing of signals during the method of performing a register write operation of FIG. 3.

Register write timing diagram 70 of FIG. 4 illustrates the timing of the prescribed register write method above. The three signal lines of register write timing diagram 70 include chip select CS line 72, clock signal SCK line 74, and data input SI line 76. As discussed above, master 12 initiates communication with controller 14 by setting the CS 16 signal low, as generally indicated by reference numeral 78.

The first rising edge 80 of clock signal SCK 18 corresponds to the most significant bit (MSB) of register write command signal 82 (represented in hexadecimal format as 1Fh). Immediately following the 8-bit command signal, master 12 sends a one-byte register address signal 84 MSB first, subsequently followed by a one-byte data signal 86, also MSB first. Communication terminates when master 12 sets the CS 16 signal, as generally indicated by reference numeral 88.

Figure 5:
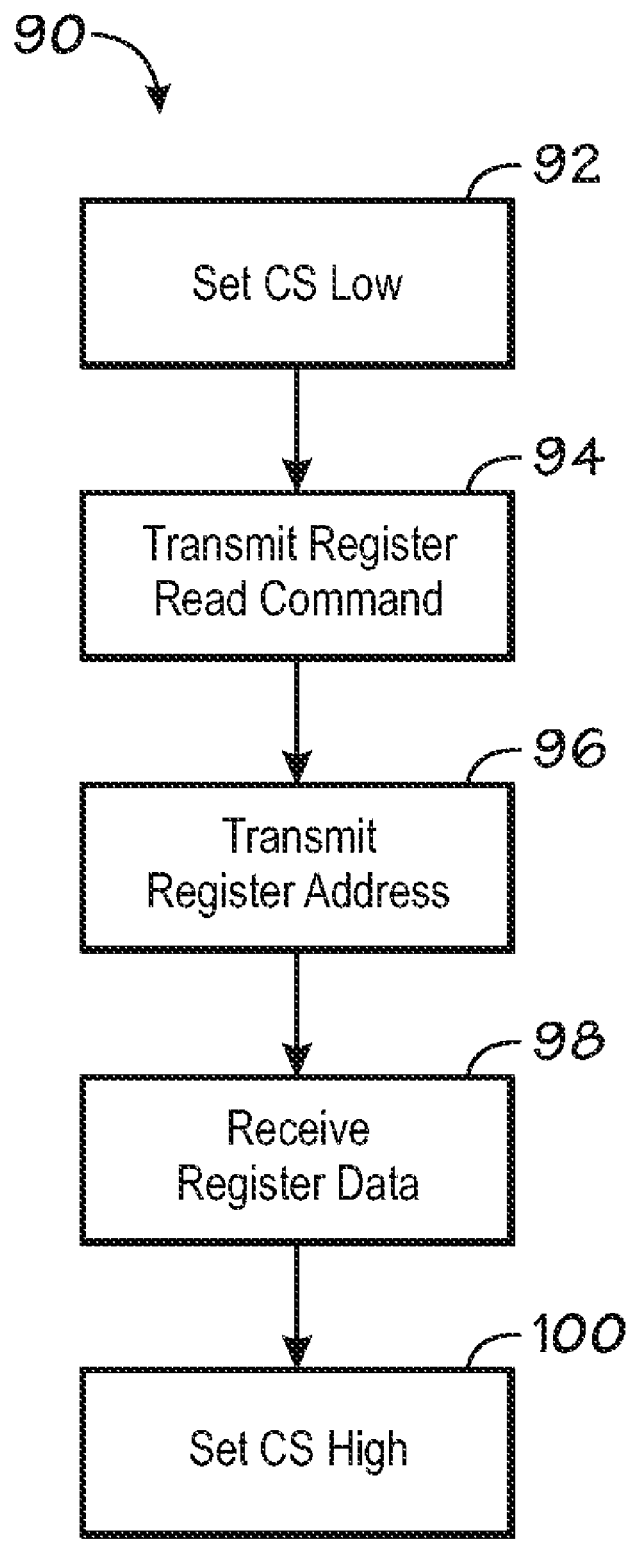
FIG. 5 is a flow chart illustrating a method of performing a register read operation using the memory device of FIG. 1.

Turning to FIG. 5, register read method 90 instructs controller 14 to output the contents of one of the memory registers 24. Beginning at step 92, master 12 first enables controller 14 by setting the CS 16 signal low. Next, master 12 sends an eight bit register read command signal across SI 20, represented in hexadecimal format as 0Fh, in step 94. As discussed above, alternative embodiments may employ a command signal of any predetermined length that a state machine of controller 14 may accommodate.

In step 96, master 12 transmits a one-byte address signal representing the address of a memory register from which to read. As above, though the present embodiment sends a register address signal of one byte, alternative embodiments may employ a register address of any size, but typically a whole number of bytes. To the extent a register address may comprise a number of bits not a multiple of eight, dummy bits may be sent to fill spaces, which controller 14 may simply ignore as "don't care" bits.

Controller 14 immediately returns the register data from the requested address via SO 22, and in step 98 master 12 subsequently receives the register data. Though the registers 24 of SPI NAND memory device 10 each comprise only one byte of data, alternative embodiments may employ registers 24 including a greater whole number of data bytes. Once master 12 has received the register data, master 12 thereafter terminates the communication sequence by setting CS 16 high.

Figure 6:
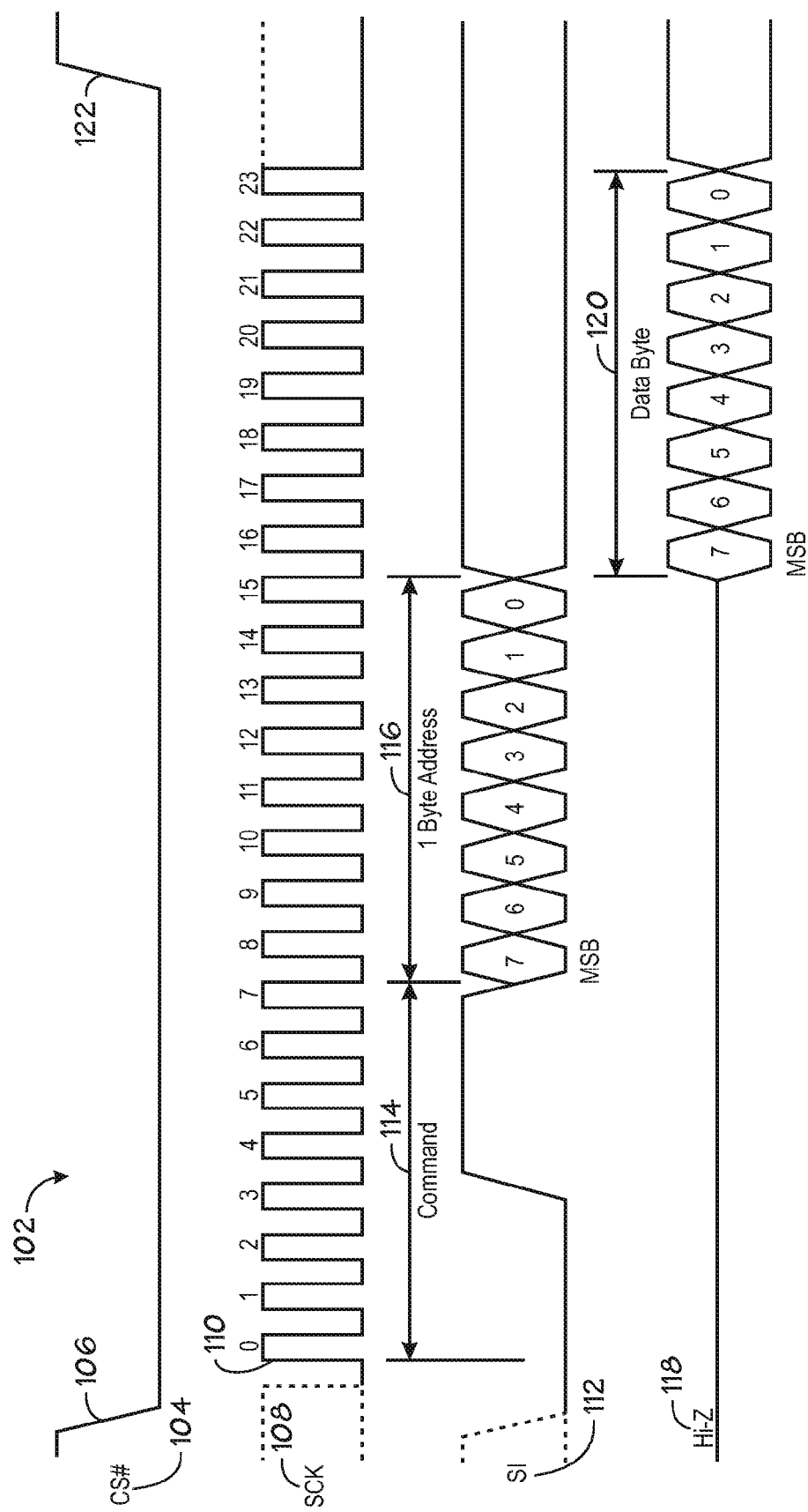
FIG. 6 is a timing diagram illustrating the timing of signals during the method of performing a register read operation of FIG. 5.

FIG. 6 provides a register read timing diagram 102 which illustrates the timing of the prescribed register read method above. Communication between master 12 and controller 14 initiates when CS signal line 104 transitions from high to low, as generally indicated by reference numeral 106. Clock signal SCK line 108 provides the timing of clock signal 18. When clock signal 18 issues a first rising edge 110, data input SI line 112 indicates a register read command signal 114 is correspondingly sent by master 12.

Immediately following the register read command signal 114, represented in hexadecimal format as 0Fh, master 12 sends a one-byte register address signal 116. Subsequently, controller 14 sends a one-byte data signal 120 from the requested memory register on data output SO line 118. Communication terminates when master 12 sets the CS 16 signal high, as generally indicated by reference numeral 122.

Figure 7:
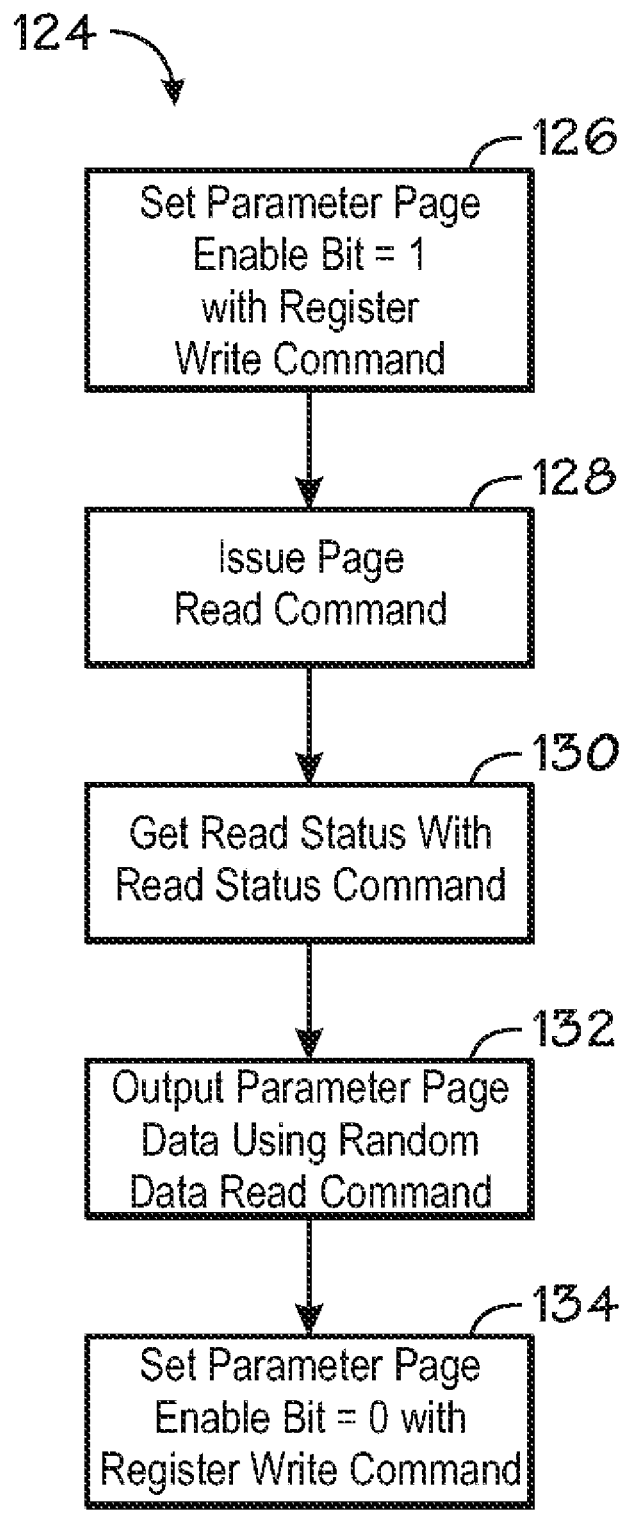
FIG. 7 is a flow chart illustrating a method of reading a parameter page of the memory device of FIG. 1.

Referring to FIG. 7, a method 124 illustrates one embodiment of a technique for accessing a parameter page in memory. A parameter page may store device parameters, such as cell type (e.g., SLC or MLC), block size, spare area size, organization, device ID, manufacturer ID, ECC capabilities, etc. Though the parameter page may comprise many bytes of data, five bytes may suffice to encode all parameters.

Rather than introduce additional commands exclusively for performing parameter page operations, the method of accessing a parameter page 124 instead prescribes the use of shared ordinary commands in a special operational mode. When a controller 14 enters a special operational mode, a master 12 may issue a shared ordinary command, such as page read, read status, or random data read, to perform a new operation to achieve a result not possible in an ordinary operational mode. Although the foregoing discussion relates primarily to an application of the method in SPI NAND memory device 10, the technique may apply generally to any NAND flash memory device where a reduced set of commands may be desired.

Referring again to FIG. 7, step 126 provides that a master 12 first sets a parameter page enable bit in a parameter page access register to enter a parameter page access mode. Master 12 may set the enable bit by issuing a register write command addressed to the parameter page access register, sending a data byte in which a prior-designated enable bit is set high. Optionally, master 12 may first perform a register read command to assess current parameter page access register data, copy the current data, then issue a register write command to send the data with only a parameter page enable bit changed to high. Once the parameter page enable bit has been set high, controller 14 enters a parameter page access mode.

Having entered a parameter page access mode in step 126, master 12 may read parameter page contents by issuing standard commands. In step 128, master 12 issues a page read command. When a page read command is performed in an ordinary operational mode, the NAND flash memory device 10 prepares a page of memory to be read from a given address of NAND memory array 40. In a parameter page access mode, however, the page read command prepares to read the contents of the parameter page. Master 12 next polls the controller 14 for read status in step 130 by issuing a read status command. The read status command operates to align the data transmission by indicating when master 12 may begin to read data from the device. Master 12 may issue numerous read status commands before controller 14 returns data indicating master 12 may begin to read the data.

During step 132, master 12 obtains parameter page data by issuing a random data read command, causing controller 14 to output the contents of the parameter page via SO 22. To exit the parameter page access mode and return to an ordinary operational mode, in step 134, master 12 resets the parameter page access enable bit. Issuing a register write command addressed to the parameter page access register, master 12 sends a data byte in which the parameter page enable bit has been set low, and controller 14 returns to an ordinary operational mode.

Figure 8:
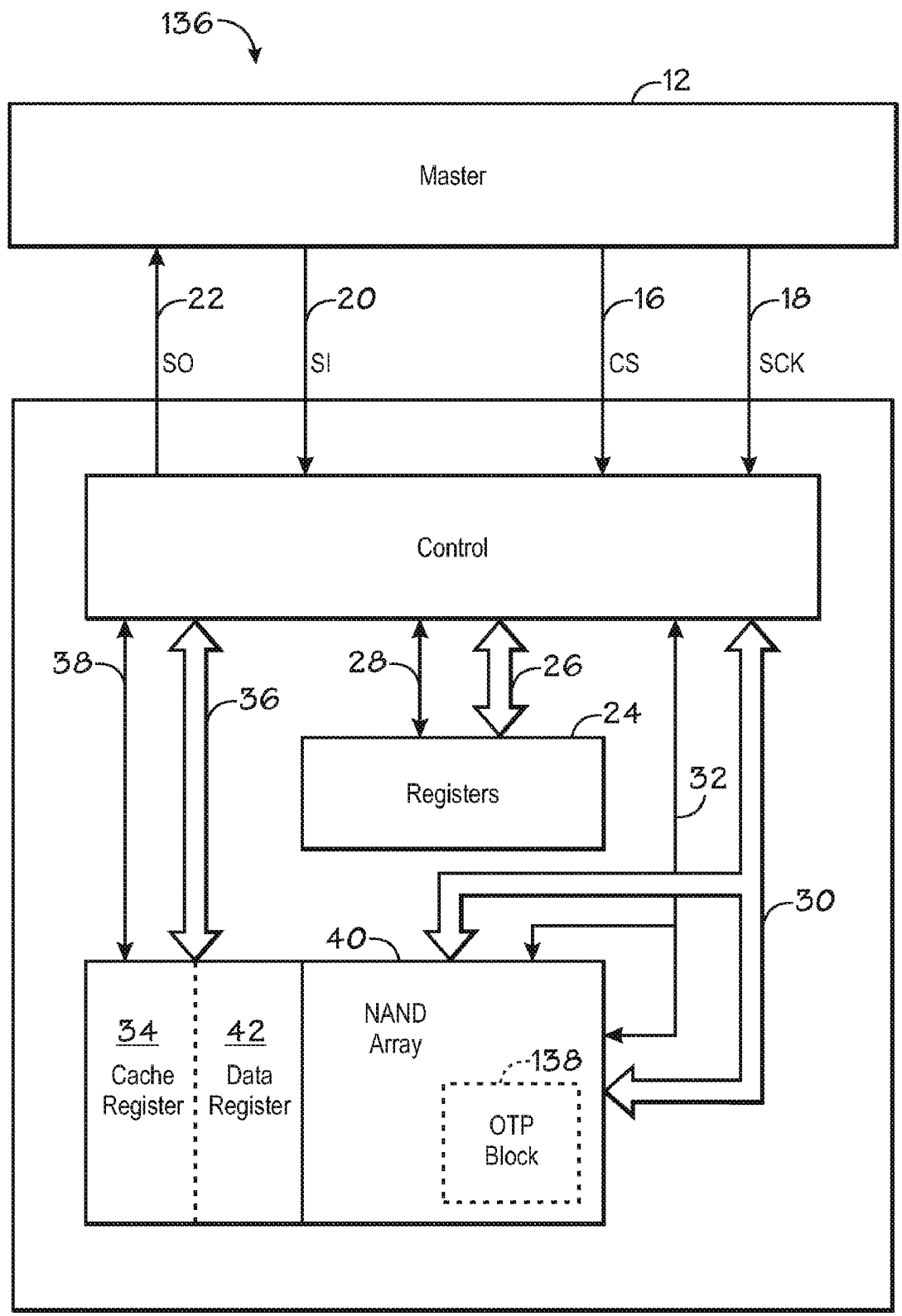
FIG. 8 is a block diagram of an SPI NAND memory device configured to include a block of one time programmable (OTP) memory in accordance with an embodiment of the invention.

FIG. 8 illustrates a NAND flash memory device 136 having a block of one time programmable (OTP) memory, depicted as OTP block 138. OTP block 138 may appear as a block of the NAND memory array 40, but alternatively may be any nonvolatile memory. Each page of OTP block 138 may be written on a fixed number of times, typically one to four times, before a page lock bit is set, permanently locking the page from modification. Alternatively, a user may choose to lock each page or the entire block of OTP memory of OTP block 138. OTP memory may find a particular use in security applications. For example, a user may program OTP memory to store and protect values for code authentication.

In the same manner as NAND flash memory device 10, NAND flash memory device 136 includes a master 12 interconnected to controller 14 via chip select CS signal 16, clock signal SCK 18, data input signal SI 20, and data output signal SO 22. Controller 14 accesses volatile memory registers 24, which includes an OTP enable register, using bus 26 and control wire 28. To perform operations on the OTP block 138 in NAND memory, controller 14 may send an OTP page address via bus 30 to a row decoder and column decoder on NAND memory array 40, controlled via control wire 32. Controller 14 may send data to cache register 34 across bus 36, controlled via control wire 38. Cache register 34 may thereafter load the data into a page of OTP block 138 memory in conjunction with data register 42.

Figure 9:
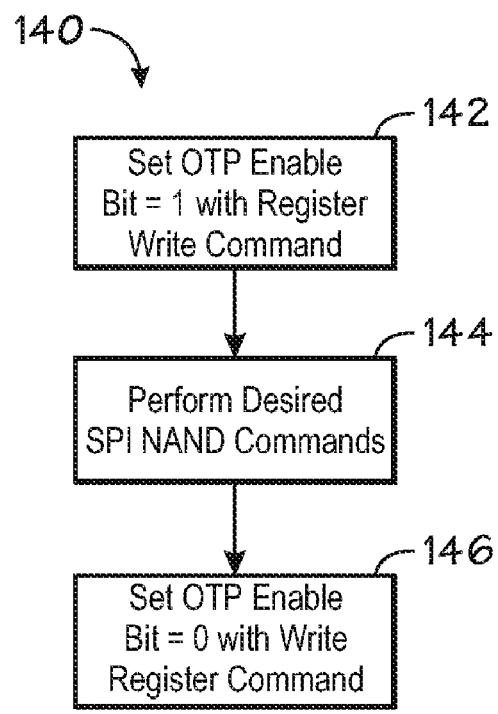
FIG. 9 is a flow chart illustrating a method of performing operations on one time programmable (OTP) memory in the memory device of FIG. 8.

FIG. 9 illustrates a method of accessing a block of one time programmable (OTP) memory 140. Rather than introduce additional commands exclusively for performing OTP operations, the method of accessing a block of OTP memory 140 instead prescribes the use of shared ordinary commands in a special operational mode. When a controller 14 enters a special operational mode, a master 12 may issue shared ordinary commands, such as page read, read status, and random data read, to perform new operations to achieve a result not possible in an ordinary operational mode. Although the foregoing discussion relates primarily to an application of the method in SPI NAND memory device 136, the technique may apply generally to any NAND flash memory device where a reduced set of commands may be desired.

The method of accessing a block of one time programmable (OTP) memory 140 begins at step 142, when an OTP enable bit in an OTP enable register is set high. Master 12 may set the enable bit by issuing a register write command addressed to the OTP enable register, sending a data byte in which a prior-designated OTP enable bit is set high. Optionally, master 12 may first perform a register read command to assess current OTP enable register data, copy the current data, then issue a register write command to send the data in which only the OTP enable bit has changed. Once the OTP enable bit has been set high, controller 14 enters an OTP block access mode.

Optionally, OTP password protection may preclude writing to or even reading the OTP block. Controller 14 may require master 12 to enter a password of a predetermined number of bits into an OTP password register in registers 24 using a register write command. Checking the entered password against a preexisting password stored in nonvolatile memory, controller 14 may allow master 12 to access OTP memory if the entered and preexisting password match.

Having entered an OTP block access mode in step 142, master 12 may subsequently perform operations on the OTP block by issuing standard commands. In step 144, master 12 may read from the OTP block using commands such as page read, read status, and read random data read. Additionally, master 12 may also write to the OTP block using commands such as program load, program random data input, program execute, page read, and random data input.

After performing a predetermined number of operations on a particular page of OTP block 138, typically one to four operations, the controller 14 may cause the page to become locked such that data may no longer be written to the page. However, as long as controller 14 remains in OTP block access mode, master 12 may perform operations to read OTP page data.

To exit OTP block access mode and return to an ordinary operational mode, step 146 prescribes resetting the OTP enable bit. Issuing a register write command addressed to the OTP enable register, master 12 may send a data byte in which the OTP enable bit has been set low, and controller 14 may return to an ordinary operational mode.

Though completing a predetermined number of operations on a page of OTP memory may lock out additional writing to the page, a user may also lock a given page, as described below. In either case, controller 14 may lock the page by causing an OTP lock bit to be set at a designated separate lock block of memory, with the lock bit associated with the address location of the page in the OTP block. Additionally or alternatively, controller 14 may lock the page by causing an OTP lock bit to be set in a byte in a spare region located at the page.

Figure 10:
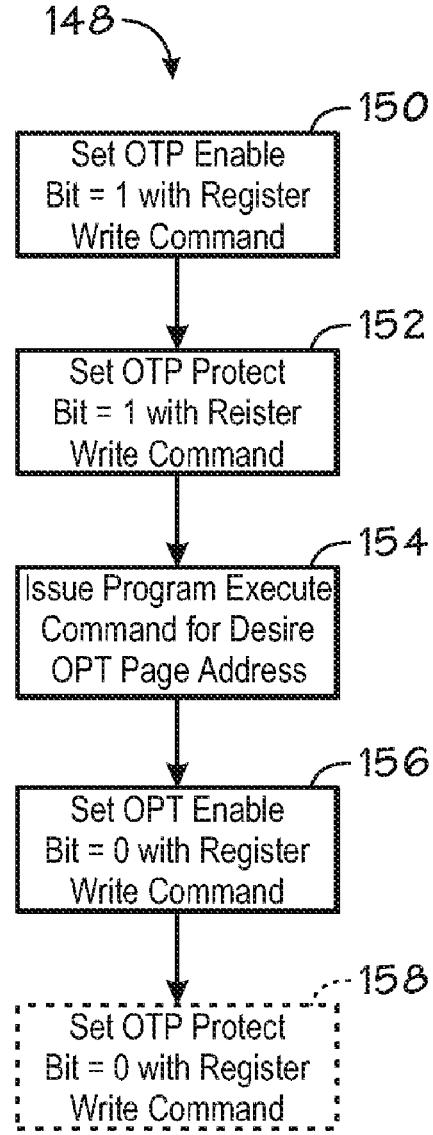
FIG. 10 is a flow chart illustrating a method of write protecting one time programmable (OTP) memory by page or block in the memory device of FIG. 8.

Turning to FIG. 10, a method 148 illustrates one embodiment of a technique for preventing writing to (i.e., locking) a page of one time programmable (OTP) memory. The method of locking a page of OTP memory 148 begins at step 150, when master 12 sets an OTP enable bit in an OTP enable register, causing the controller 14 to enter an OTP block access mode. Master 12 may set the enable bit by issuing a register write command addressed to the OTP enable register, sending a data byte in which a prior-designated OTP enable bit is set high. Optionally, master 12 may first perform a register read command to assess current OTP enable register data, copy the current data, then issue a register write command to send the data in which only the OTP enable bit has changed. Once the OTP enable bit has been set high, controller 14 enters an OTP block access mode.

Next step 152 provides that master 12 may next set an OTP protect bit in an OTP protect register. As above, master 12 may issue a register write command addressed to the OTP protect register, sending a data byte in which a prior-designated OTP enable bit is set high. Alternatively, because the OTP protect bit comprises only a single bit, and a register may comprise an entire byte, the OTP protect bit may reside instead in the OTP enable register alongside the OTP enable bit. Accordingly, steps 150 and 152 may be combined, wherein master 12 may issue only a single register write command addressed to the OTP enable register, sending a data byte that sets high both the OTP enable bit and OTP protect bit.

Upon reaching step 154, with both the OTP enable bit and OTP protect bit set high, controller 14 may have entered an OTP write protect mode. To lock a particular page of OTP memory in OTP block 138, master 12 may issue a program execute command addressed to a desired unlocked page. Controller 14 may respond by causing an OTP lock bit to be set at a designated separate lock block of memory, with the lock bit associated with the address location of the page in the OTP block 138. Additionally or alternatively, controller 14 may instead cause an OTP lock bit to be set in a byte in a spare region located at the page.

To return to an ordinary operational mode in step 156, master 12 may issue a write register command to set the OTP enable bit low in the same manner as step 150. In step 158, master 12 may subsequently issue an additional write register command to set the OTP protect bit low in the same manner as step 152. Alternatively, if the OTP protect bit and the OTP enable bit both reside in a single OTP enable register, steps 150 and 152 may be combined, wherein master 12 may issue only a single register write command addressed to the OTP enable register, sending a data byte setting low both the OTP enable bit and OTP protect bit.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of operating an SPI NAND flash memory device comprising:
   sending an enable signal to a first NAND memory circuit input;
   sending a clock signal to a second NAND memory circuit input;
   sending a register write command signal to a third NAND memory circuit input, wherein the register write command signal is synchronized to the clock signal;
   sending a memory register address signal to the third NAND memory circuit input, wherein the memory register address signal is synchronized to the clock signal; and
   sending a data signal to the third NAND memory circuit input, wherein the data signal is synchronized to the clock signal.

2. The method of claim 1, wherein sending the memory register address signal to the third NAND memory circuit input immediately follows sending the register write command signal to the third NAND memory circuit input, and wherein sending the data signal to the third NAND memory circuit input immediately follows sending the memory register address signal to the third NAND memory circuit input.

3. The method of claim 1, wherein sending the register write command signal to the third NAND memory circuit input, sending the memory register address signal to the third NAND memory circuit input, and sending the data signal to the third NAND memory circuit input each comprises sending a one-byte signal.

4. The method of claim 1, wherein sending the register write command signal to the third NAND memory circuit input comprises sending a register write command of one byte to the third NAND memory circuit input.

5. The method of claim 4, wherein sending the register write command of one byte to the third NAND memory circuit input comprises sending a signal with a hexadecimal format of 1Fh to the third NAND memory circuit input.

6. A method of operating a NAND flash memory device comprising:
   sending an enable signal to a first NAND flash input pin;
   sending a master clock signal to a second NAND flash input pin;
   at the start of a first rising clock edge of the master clock signal, sending a one-byte register read command to a third NAND flash input pin, wherein the one-byte register read command corresponds synchronously to the master clock signal;
   immediately after sending the one-byte register read command to the third NAND flash input pin, sending a register address to the third NAND flash input pin, wherein the register address corresponds synchronously to the master clock signal; and
   receiving output data from an output pin, wherein the output data corresponds synchronously to the master clock signal.

7. The method of claim 6, wherein sending the one-byte register read command to the third NAND flash input pin comprises sending a byte having a hexadecimal format of 0Fh to the third NAND flash input pin.

8. The method of claim 6, wherein receiving output data from an output pin immediately follows sending a register address to the third NAND flash input pin.

9. The method of claim 6, wherein sending the register address to the third NAND flash input pin comprises sending a one-byte signal corresponding to the register address to the third NAND flash input pin.

* * * * *